(12) United States Patent
Morita (10) Patent No.: US 11,878,538 B2
(45) Date of Patent: Jan. 23, 2024

(54) COVER OPENING AND CLOSING DEVICE AND IMAGE FORMING APPARATUS

(71) Applicant: KYOCERA Document Solutions Inc., Osaka (JP)

(72) Inventor: Takashi Morita, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 617 days.

(21) Appl. No.: 17/053,859

(22) PCT Filed: May 8, 2019

(86) PCT No.: PCT/JP2019/018406
§ 371 (c)(1),
(2) Date: Nov. 9, 2020

(87) PCT Pub. No.: WO2019/216344
PCT Pub. Date: Nov. 14, 2019

(65) Prior Publication Data
US 2021/0129560 A1 May 6, 2021

(30) Foreign Application Priority Data
May 11, 2018 (JP) .................................. 2018-092323

(51) Int. Cl.
| | |
|---|---|
| B41J 29/13 | (2006.01) |
| H05K 5/02 | (2006.01) |
| H05K 5/03 | (2006.01) |
| B41J 29/02 | (2006.01) |

(52) U.S. Cl.
CPC ............... *B41J 29/13* (2013.01); *B41J 29/02* (2013.01); *H05K 5/0221* (2013.01); *H05K 5/03* (2013.01)

(58) Field of Classification Search
CPC ......... B41J 29/13; B41J 29/02; H05K 5/0221; H05K 5/03; G03G 21/15
See application file for complete search history.

(56) References Cited

U.S. PATENT DOCUMENTS

| | | | |
|---|---|---|---|
| 9,272,856 B2 | 3/2016 | Okura | |
| 2015/0130125 A1 | 5/2015 | Okura | |
| 2019/0227478 A1* | 7/2019 | Kikura | ..................... B41J 29/13 |
| 2019/0240991 A1* | 8/2019 | Komagome | ............... B41J 2/35 |

FOREIGN PATENT DOCUMENTS

| | | |
|---|---|---|
| JP | 2000-098681 A | 4/2000 |
| JP | 2007-027395 A | 2/2007 |
| JP | 2014-015025 A | 1/2014 |
| JP | 2015-094888 A | 5/2015 |

* cited by examiner

*Primary Examiner* — Sharon Polk
(74) *Attorney, Agent, or Firm* — Studebaker & Brackett PC (57) ABSTRACT

A cover opening and closing device (100) includes a cover section (110), a rotary shaft (X), and a plurality of locking sections (120). The cover section (110) covers an opening (23) of a main body section (2). The rotary shaft (X) connects the cover section (110) to the main body section (2) in a manner that the cover section (110) is pivotal between a first position and a second position. The locking sections (120) lock the cover section (110) in the first position. The first position is a position in which the cover section (110) covers the opening (23). The second position is a position in which the cover section (110) does not cover the opening (23). When at least one of the locking sections (120) is not locking the cover section (110), the cover section (110) pivots from the first position to the second position.

10 Claims, 10 Drawing Sheets

-PRIOR ART-

COVER OPENING AND CLOSING DEVICE AND IMAGE FORMING APPARATUS

TECHNICAL FIELD

The present invention relates to a cover opening and closing device and an image forming apparatus.

BACKGROUND ART

Heretofore, image forming apparatuses are provided which prevent partial closure. As an example of such an image forming apparatus, an image forming apparatus described in Patent Literature 1 includes a cover and a plurality of locking claws. The cover pivots around the lower side of the apparatus as an axis to open and close. The locking claws are located on a central part of the cover and near the edges of the cover. A locking claw located in a central position shifts the timing at which the locking claw located at the central position reaches a locked position so as to reach the locked position after the other locking claws have reached respective locked positions. A detection means detects that the cover is closed. In the image forming apparatus described in Patent Literature 1, the cover is fixed by all of the locking claws through the locking claw located at the central position shifting the timing at which the locking claw located at the central position reaches the locked position so as to reach the locked position after the other locking claws have reached the locked positions.

CITATION LIST

Patent Literature

Patent Literature 1

Patent Literature 1: Japanese Patent Application Laid-Open Publication No. 2000-98681

SUMMARY OF INVENTION

Technical Problem

However, in the image forming apparatus described in Patent Literature 1, the cover can be closed by all of the locking claws reaching the locked positions, but in a case in which partial closure occurs, the partial closure cannot be resolved.

The present invention takes the above problem into account, and aims to provide a cover opening and closing device and an image forming apparatus capable of resolving partial closure.

Solution to Problem

A cover opening and closing device according to the present invention includes a cover section, a rotary shaft, and a plurality of locking sections. The cover section covers an opening of a main body section. The rotary shaft connects the cover section to the main body section in a manner that the cover section is pivotal between a first position and a second position. The locking sections lock the cover section in the first position. The first position is a position in which the cover section covers the opening. The second position is a position in which the cover section does not cover the opening. When at least one of the locking sections is not locking the cover section, the cover section pivots from the first position to the second position.

An image forming apparatus according to the present invention includes a cover opening and closing device and a main body section having an opening.

Advantageous Effects of Invention

According to the present invention, partial closure can be resolved.

DESCRIPTION OF EMBODIMENTS

The following describes embodiments of the present invention with reference to the accompanying drawings. Elements that are the same or equivalent are labeled with the same reference signs in the drawings and description thereof is not repeated.

First Embodiment

Figure 1:
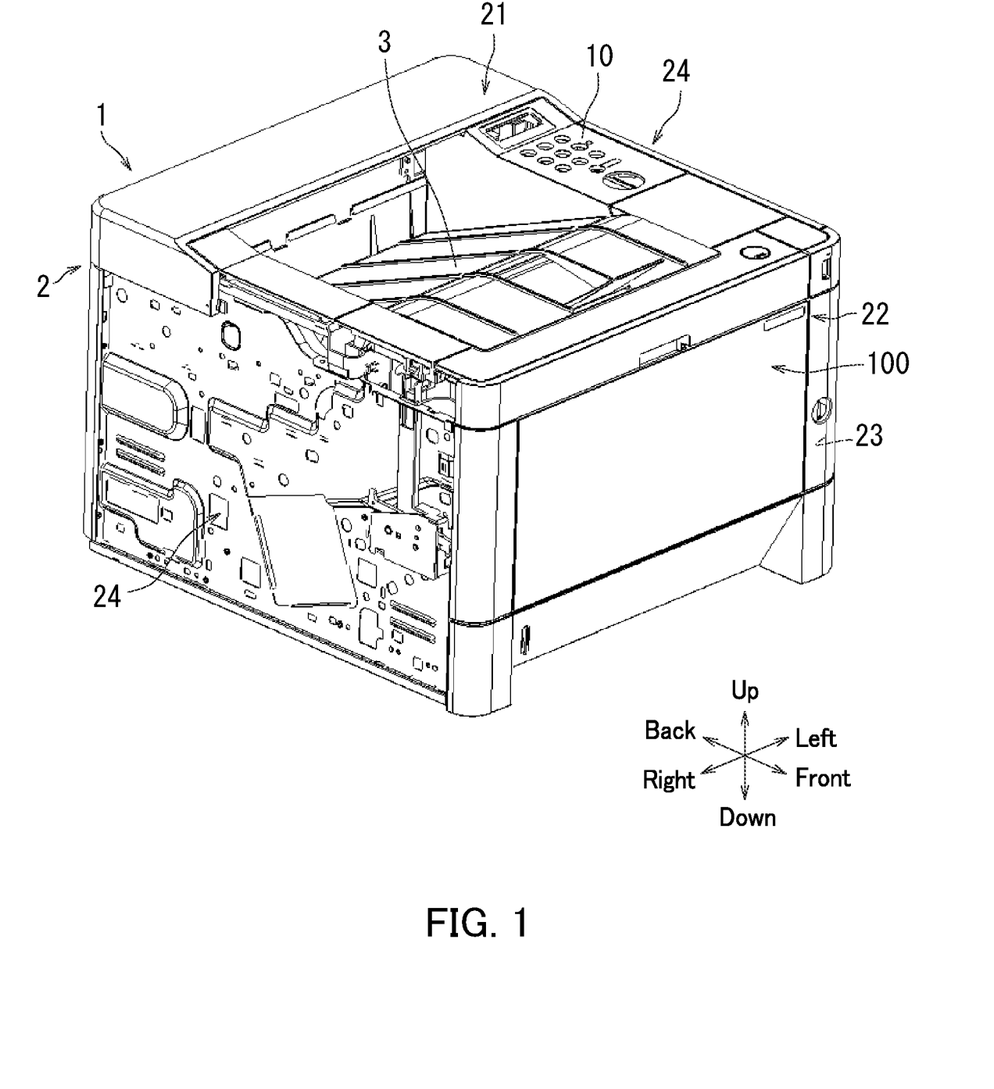
FIG. 1 is a diagram illustrating an image forming apparatus including a cover opening and closing device according to a first embodiment of the present invention.

The following describes a cover opening and closing device 100 according to an embodiment of the present invention with reference to FIG. 1. FIG. 1 illustrates an image forming apparatus 1 which includes the cover opening and closing device 100 according to a first embodiment. As illustrated in FIG. 1, the image forming apparatus 1 includes a main body section 2 and the cover opening and closing device 100.

The main body section 2 has an upper surface 21, a front surface 22, an opening 23, and side surfaces 24. The upper surface 21 covers the top of the main body section 2. An exit tray 3 and an operation panel 10 are located on the upper surface 21. The exit tray 3 holds an ejected sheet. The operation panel 10 receives instructions for the image forming apparatus 1 from a user. The front surface 22 covers a portion of the front of the main body section 2. The opening 23 is positioned in the front surface 22 of the main body section 2. The opening 23 communicates the inside of the main body section 2 with the outside of the main body section 2. The opening 23 is a space inside of the main body section 2, between one side surface 24 and the other side surface 24. The side surfaces 24 cover the sides of the main body section 2.

The main body section 2 also internally houses a feeding section (not illustrated), a conveyance section (not illustrated), an image forming section (not illustrated), a fixing section (not illustrated), and an ejection section (not illustrated). The feeding section guides a sheet to the conveyance section. The conveyance section conveys the sheet toward the image forming section. The image forming section firms an image on the sheet. The ejection section ejects the sheet onto the exit tray 3.

The cover opening and closing device 100 opens and closes the opening 23. Specifically, the cover opening and closing device 100 closes the opening 23 and opens the opening 23.

Figure 2:
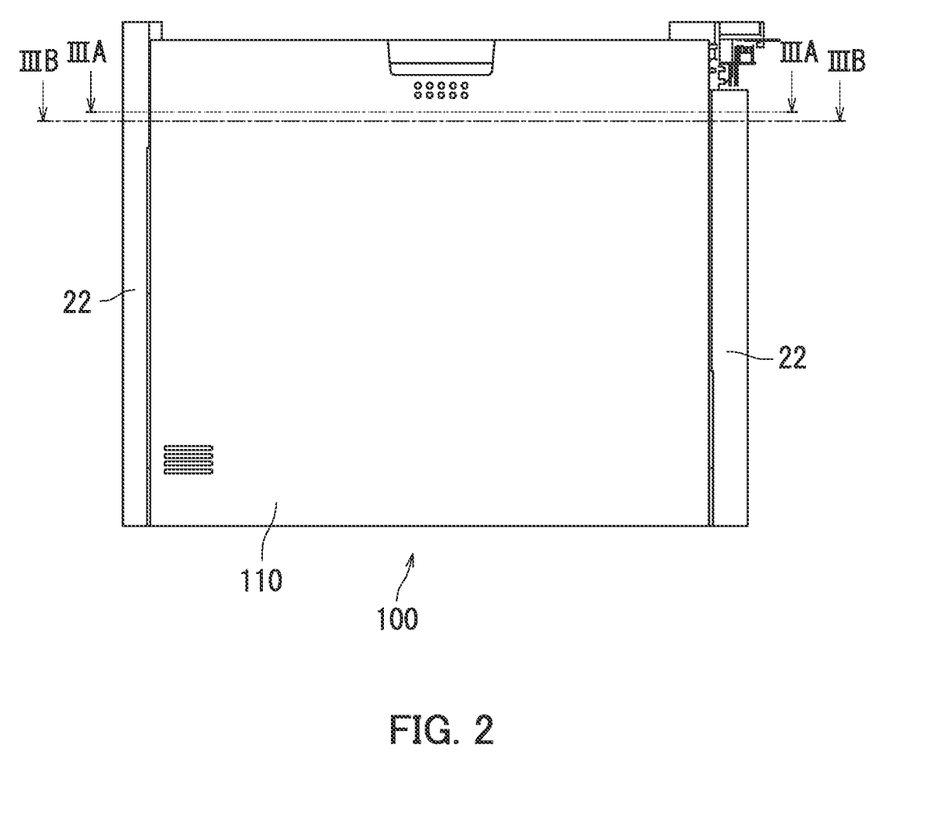
FIG. 2 is a diagram illustrating the cover opening and closing device covering an opening.
Figure 3A:
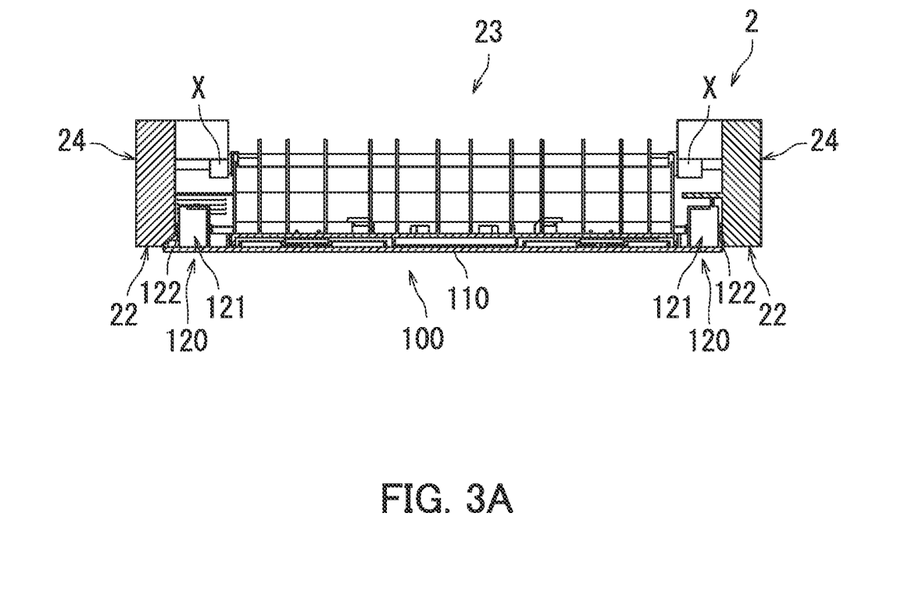
FIG. 3A is a diagram illustrating a cross section of the cover opening and closing device illustrated in FIG. 2 taken along a line IIIa-IIIa.
Figure 3B:
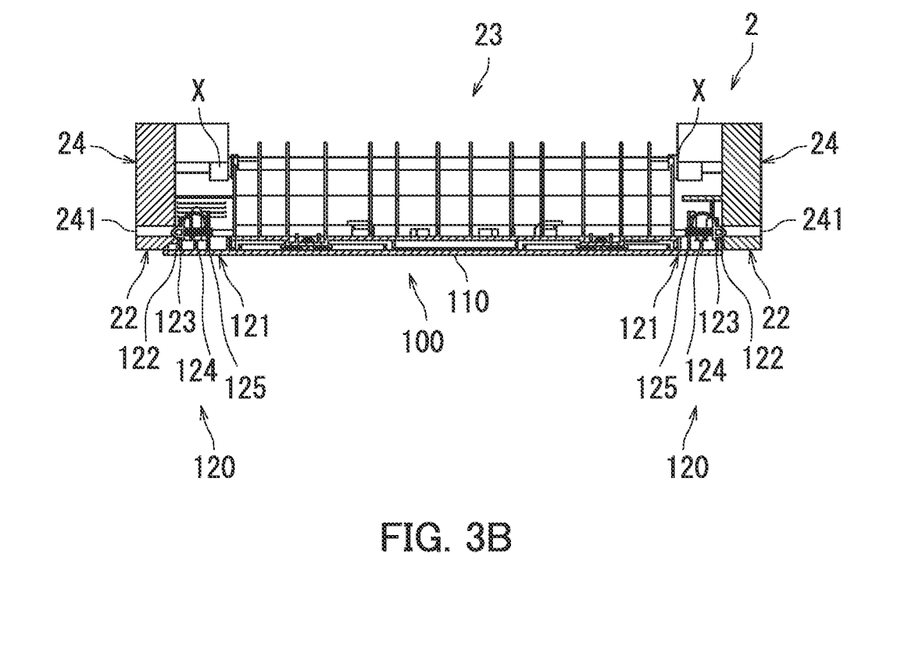
FIG. 3B is a diagram illustrating a cross section of the cover opening and closing device illustrated in FIG. 2 taken along a line IIIb-IIIb.

Next, the cover opening and closing device 100 is described in detail with reference to FIGS. 2, 3A, and 3B. FIG. 2 illustrates the cover opening and closing device 100 covering the opening 23. FIG. 3A illustrates a cross section of the cover opening and closing device 100 illustrated in FIG. 2 taken along a line IIIa-IIIa. FIG. 3B illustrates a cross section of the cover opening and closing device 100 illustrated in FIG. 2 taken along a line IIIb-IIIb.

As illustrated in FIG. 3A, the cover opening and closing device 100 includes a cover section 110, locking sections 120, and a rotary shaft X.

The cover section 110 opens and closes the opening 23. The cover section 110 covers the opening 23 of the main body section 2. The cover section 110 is located on the front surface 22 of the main body section 2.

The locking sections 120 lock the cover section 110 to the main body section 2. The locking sections 120 are located on edges of the cover section 110. A plurality of locking sections 120 is located on the cover section 110. Two locking sections 120 are located on the cover section 110. The locking sections 120 are located near the side surfaces 24 of the main body section 2.

As illustrated in FIG. 3A, each locking section 120 includes a protrusion holding section 121 and a protrusion body 122. The protrusion holding section 121 holds the protrusion body 122. The protrusion holding section 121 is equivalent to an example of a "holding section". As illustrated in FIG. 3B, the protrusion holding section 121 has a first wall section 123, a second wall section 125, and a compression spring 124. Each side surface 24 of the main body section 2 illustrated in FIG. 3B includes a locking hole 241. The locking hole 241 communicates the outside of the main body section 2 to the inside of the main body section 2.

The first wall section 123 is opposite to the side surface 24 of the main body section 2. The first wall section 123 is equivalent to a "side opposite to the main body section 2". The first wall section 123 runs along the side surface 24 of the main body section 2. The first wall section 123 protrudes from the cover section 110 toward the opening 23. The first wall section 123 has a through hole.

The second wall section 125 is opposite to the first wall section 123. The second wall section 125 runs along the side surface 24 of the main body section 2. The second wall section 125 protrudes from the cover section 110 toward the opening 23. The second wall section 125 has a holding section which holds the compression spring 124.

The compression spring 124 presses against the protrusion body 122. The compression spring 124 is positioned between the first wall section 123 and the second wall section 125 in a compressed state. The holding section of the second wall section 125 holds the compression spring 124.

The protrusion body 122 protrudes toward the main body section 2. Specifically, the protrusion body 122 protrudes toward the locking hole 241. The protrusion body 122 includes a protruding section and a flange section. The protruding section has an inclined surface which runs from the tip of the protruding section to the flange section. The flange section is larger than the through hole of the first wall section 123.

When the protrusion body 122 is inserted into the through hole, the protrusion body 122 is positioned between the first wall section 123 and the second wall section 125. The protruding section is then inserted into the through hole and penetrates until the flange section makes contact with the first wall section 123. As a result, the flange section can prevent the protrusion body 122 from detaching from the protrusion holding section 121.

The protrusion body 122 is pressed against the compression spring 124. Therefore, the protrusion body 122 is urged toward the side surface 24 of the main body section 2. When the protrusion body 122 is pressed against from the side surface 24, the protrusion body 122 moves toward the second wall section 125. When the protrusion body 122 is not pressed against from the side surface 24, the protrusion body 122 moves toward the side surface 24. When the inclined surface of the protrusion body 122 is pressed against, the protrusion body 122 also moves toward the second wall section 125.

The rotary shaft X pivotably supports the cover section 110. The rotary shaft X pivotally connects the cover section 110 to the main body section 2. The rotary shaft X is located in a position farther from the front surface 22 of the main body section 2 than the locking sections 120.

Figure 4A:
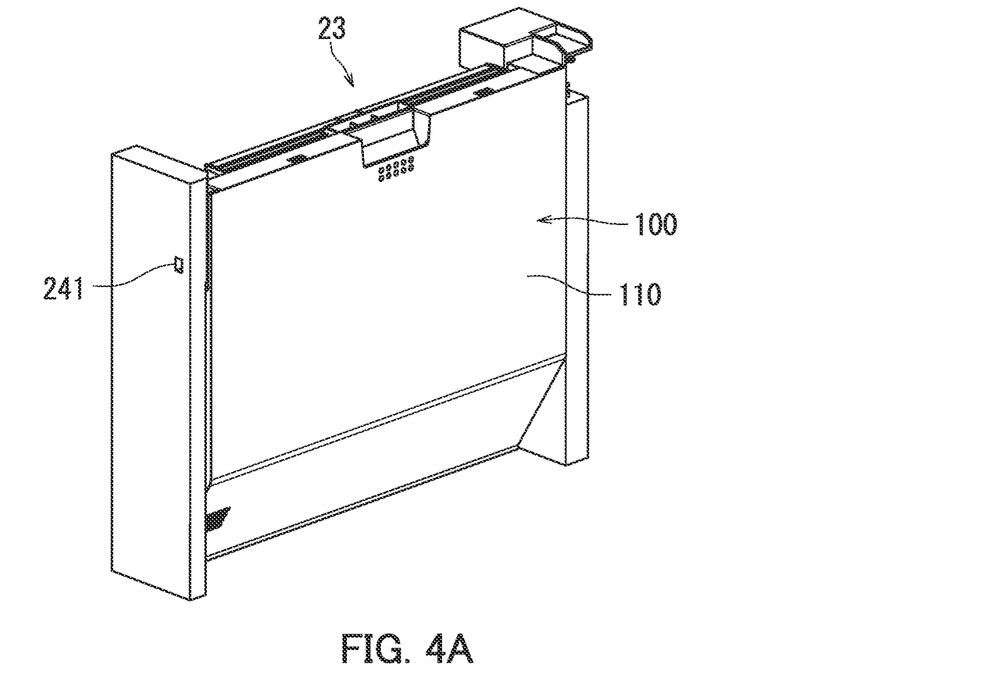
FIG. 4A is a diagram in which a cover section has been pivoted to a first position.
Figure 4B:
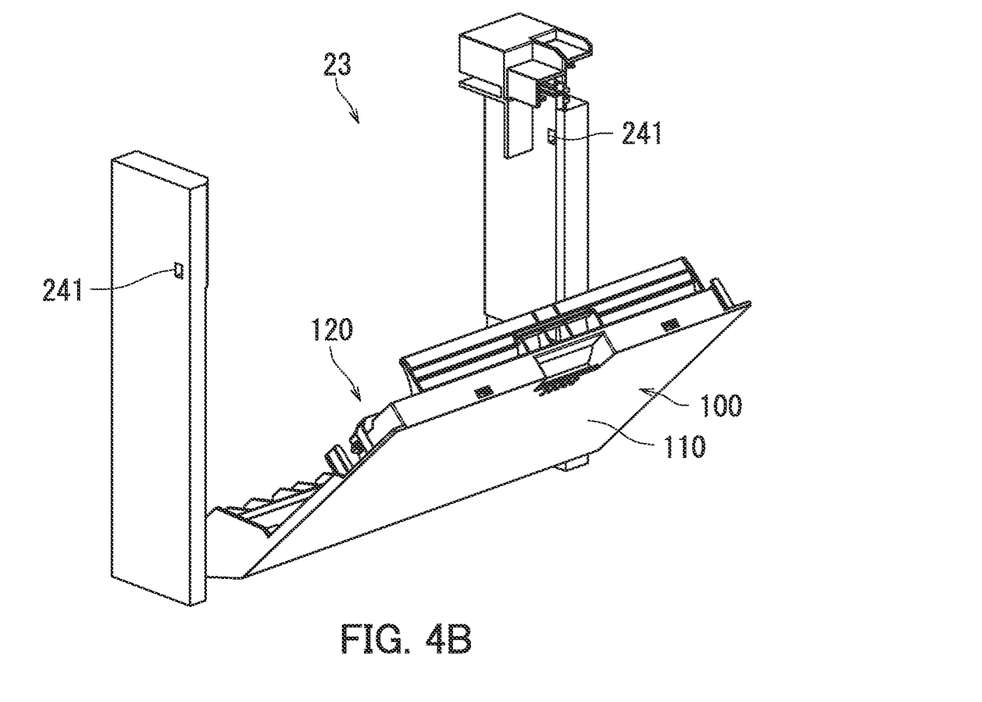
FIG. 4B is a diagram in which the cover section has been pivoted to a second position.

Next, a case in which the cover section 110 is in a first position and a case in which the cover section 110 is in a second position are described with reference to FIGS. 3A, 3B, 4A, and 4B. FIG. 4A is a diagram in which the cover section 110 has been pivoted to the first position. FIG. 4B is a diagram in which the cover section 110 has been pivoted to the second position. The rotary shaft X connects the cover section 110 to the main body section 2 in a manner that the cover section 110 is pivotal between the first position and the second position. The first position is a position in which the cover section 110 covers the opening 23. The locking sections 120 lock the cover section 110 in the first position. That is, the cover section 110 in the first position is locked to the locking holes 241 of the main body section 2 by the two locking sections 120. The second position is a position in which the cover section 110 does not cover the opening 23. The cover section 110 in the second position is not locked to the main body section 2 by the two locking sections 120.

When the cover section 110 has been pivoted to the first position, access to the inside of the main body section 2 can be prevented. For example, access to the inside of the main body section 2 can be prevented during operation of the image forming apparatus 1. When the cover section 110 has been pivoted to the second position, access to the inside of the main body section 2 is possible through the opening 23. The user opens the cover section 110 to perform maintenance work on the apparatus. The maintenance work on the apparatus is, for example, replacement of a toner container, replacement of the image forming section, replacement of the fixing section, or jam clearance processing.

Figure 5:
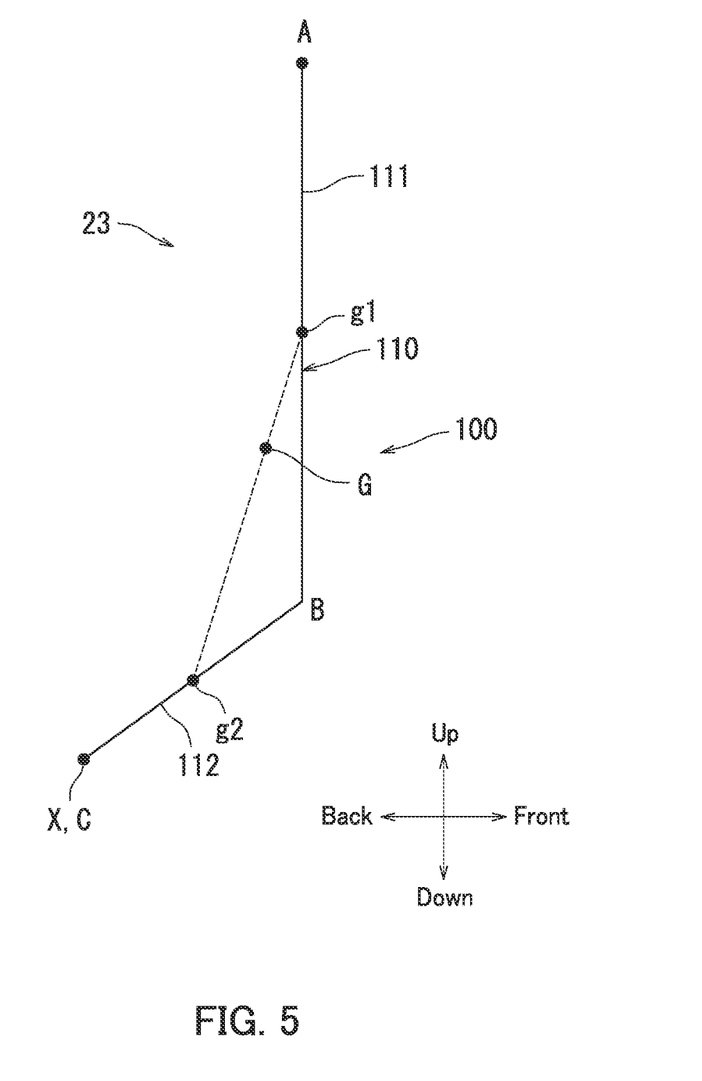
FIG. 5 is a schematic cross-sectional view of a side of the cover section.

Next, a center of gravity G of the cover section 110 is described with reference to FIGS. 4A, 4B, and 5. FIG. 5 is a schematic cross-sectional view of a side of the cover section 110. The center of gravity G is a position at the center of gravity of the cover section 110. FIG. 5 illustrates the rotary shaft X and the cover section 110. As illustrated in FIG. 5, the cover section 110 is positioned in the first position.

The cover section 110 has a first cover surface 111 and a second cover surface 112. The first cover surface 111 is positioned farther outside the main body section 2 than the rotary shaft X. Specifically, the first cover surface 111 is positioned farther outside the main body section 2 than the rotary shaft X and is arranged in the vertical direction along the front surface 22. The second cover surface 112 extends from the first cover surface 111. Specifically, the second cover surface 112 extends toward the inside of the opening 23 from the first cover surface 111 to the rotary shaft X. The first cover surface 111 is arranged in the vertical direction along the front surface 22 and the second cover surface 112 extends toward the inside of the opening 23. Therefore, the boundary between the first cover surface 111 and the second cover surface 112 bends. As such, the cover section 110 has an L-shape. Since the first cover surface 111 is positioned farther outside than the rotary shaft X, the cover section 110 easily pivots in a direction from the first position to the second position around the rotary shaft X.

The position of the center of gravity G of the cover section 110 can be calculated from a center of gravity g1 of the first cover surface 111 and a center of gravity g2 of the second cover surface 112. The first cover surface 111 is a plate-shaped member with a prescribed thickness. The weight of the first cover surface 111 is a weight W1. The center of gravity g1 of the first cover surface 111 is positioned at a center point of a side AB, for example. The second cover surface 112 is a plate-shaped member with a prescribed thickness. The weight of the second cover surface 112 is a weight W2. The center of gravity g2 of the second cover surface 112 is positioned at a center point of a side BC, for example.

The center of gravity G of the cover section 110 exists on a line segment connecting the center of gravity y1 of the first cover surface 111 and the center of gravity g2 of the second cover surface 112. A ratio of the length of a line segment Gg1 connecting the center of gravity G and the center of gravity g1 to the length of a line segment Gg2 connecting the center of gravity G and the center of gravity g2 is the same as a ratio of the weight W2 of the second cover surface 112 to the weight W1 of the first cover surface 111 (line segment Gg1:line segment Gg2 weight W2:weight W1). Accordingly, the center of gravity G is a point internally dividing a line segment connecting the center of gravity g1 and the center of gravity g2 so as to have the ratio of the weight W2 to the weight W1. The weight W1 is proportional to the length of the side AB. The weight W2 is proportional to the length of the side BC. Accordingly, the ratio of the line segment Gg1 to the line segment Gg2 matches the ratio of the side BC to the side AB.

As illustrated in FIG. 5, the center of gravity G of the cover section 110 is positioned farther outside the main body section 2 than the rotary shaft X. Specifically, the center of gravity G is positioned farther toward the front surface 22 of the main body section 2 than the rotary shaft X. Since the center of gravity G is positioned farther toward the front surface 22 of the main body section 2 than the rotary shaft X, the cover section 110 pivots in the direction from the first position to the second position around the rotary shaft X. The center of gravity G and the weight of the cover section 110 cause a pivoting force that pivots the cover section 110 in a direction toward the second position. As a result, the cover section 110 can pivot in the direction toward the second position and open the opening 23.

When at least one of the locking sections 120 is not locking the cover section 110, the cover section 110 may pivot in the direction from the first position to the second position. For example, when one of the two locking sections 120 is not locking the cover section 110 to the main body section 2, the cover section 110 pivots in the direction from the first position to the second position. In this case, one of the locking sections 120 cannot oppose the pivoting force of the cover section 110 in the direction toward the second position. The protrusion body 122 of the locking section 120 receives the pivoting force of the cover section 110 in the direction toward the second position through the inclined surface of the protrusion body 122. The force that the inclined surface has received is transmitted to the compression spring 124. The pivoting force of the cover section 110 in the direction toward the second position is greater than the pressing force of the compression spring 124 on the protrusion body 122. That is, the pivoting force of the cover section 110 in the direction toward the second position is greater than a locking force of each locking section 120 that locks the cover section 110 to the main body section 2. As such, only one of the locking sections 120 cannot oppose the pivoting force of the cover section 110 in the direction toward the second position. That is, the cover section 110 is not locked to the main body section 2 by only one of the locking sections 120. Accordingly, the protrusion body 122 moves in the direction toward the second wall section 125. As a result, even if partial closure of the cover section 110 occurs, the partial closure can be resolved. Also, the user can easily know that the cover section 110 is not closed correctly because the cover section 110 pivots in the direction toward the second position to open the opening 23. Note that when the cover section 110 is locked to the main body section 2 by the two locking sections 120, the cover section 110 is positioned in the first position.

Figure 6:
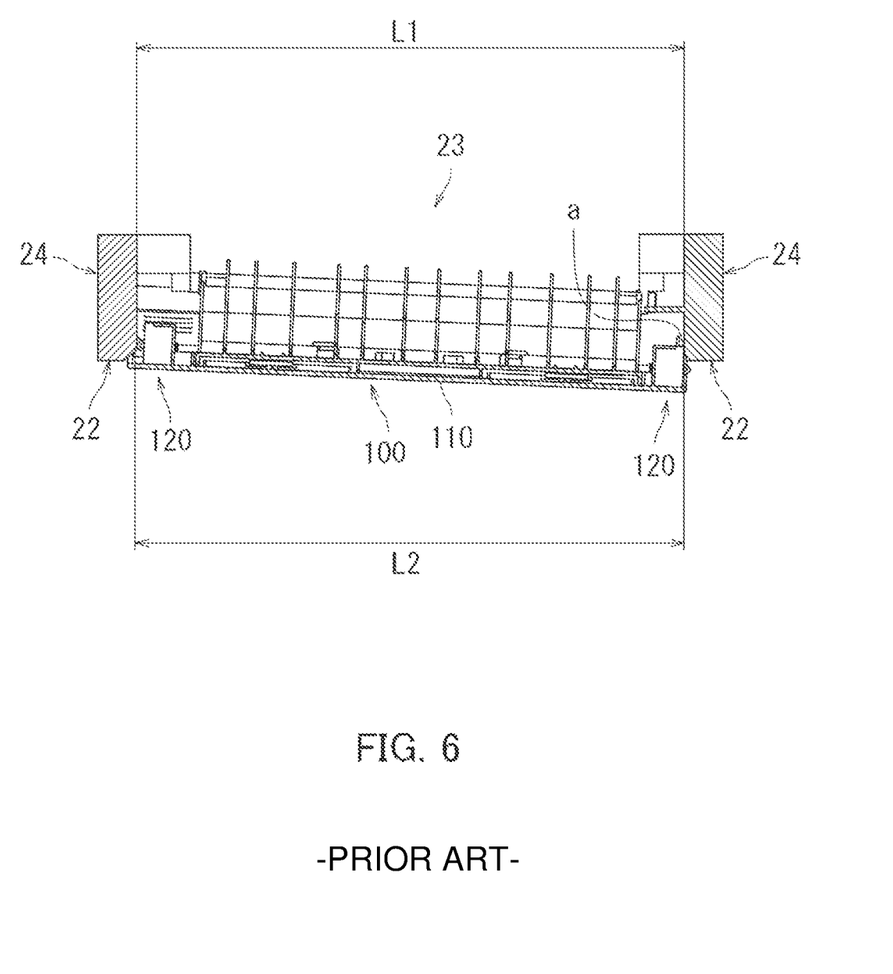
FIG. 6 is a diagram illustrating a conventional cover opening and closing device.

A case in which partial closure of the cover section 110 occurs is described with reference to FIG. 6. FIG. 6 is a diagram illustrating a conventional cover opening and closing device. The conventional cover opening and closing device illustrated in FIG. 6 is in a state where partial closure has occurred. When partial closure has occurred, one locking section 120 of the two locking sections 120 is not locked to the locking hole 241 of one of the side surfaces 24 (refer to FIG. 3). Such partial closure occurs due to a portion of the cover section 110, which is longer than a length L1, going into the opening 23 of the main body section 2. The length L1 is a horizontal length of the opening 23. The length L1 is equal to a length from one side surface 24 to the other side surface 24 inside the main body section 2. The portion of the cover section 110 is a portion from the protrusion body 122 of one locking section 120 to an edge a of the first wall section 123 of the other locking section 120. The length from the protrusion body 122 of the one locking section 120 to the edge a of the first wall section 123 of the other locking section 120 is a length L2. The length L2 is longer than the length L1.

The cover section 110 may warp in moving to the first position. The length of the warping cover section 110 from the protrusion body 122 of the one locking section 120 to the edge a of the first wall section 123 of the other locking section 120 is shorter than the length L1. As such, a portion of the warping cover section 110 ranging from the protrusion body 122 of the one locking section 120 to the edge a of the first wall section 123 of the other locking section 120 goes into the opening 23 of the main body section 2. The protrusion body 122 of the one locking section 120 then locks to the locking hole 241 (refer to FIG. 3), and the edge a of the first wall section 123 of the other locking section 120 of the cover section 110 makes contact with a corresponding one of the side surfaces 24. As a result, partial closure of the cover section 110 occurs. Upon occurrence of partial closure, a fault such as a malfunction, strange noise, or damage occurs in the image forming apparatus 1. Furthermore, in a case in which the image forming apparatus 1 includes a detector, a closed state of the cover section 110 is misdetected upon occurrence of partial closure. In a case in which a closed state of the cover section 110 is misdetected in the image forming apparatus 1, a fault such as a malfunction occurs.

However, the cover opening and closing device 100 of the present invention cannot oppose the pivoting force of the cover section 110 in the direction toward the second position with one locking section 120 when the cover section 110 is temporarily in partial closure. As such, the protrusion body 122 moves toward the second wall section 125. As a result, contact between the edge a of the first wall section 123 and the side surface 24 of the main body section 2 is released. The cover section 110 then pivots in the direction toward the second position. Accordingly, even when the cover section 110 is in partial closure, partial closure can be resolved. Also, the user can easily know that the cover section 110 is not closed correctly because the cover section 110 pivots in the direction toward the second position to open the opening 23.

Figure 7:
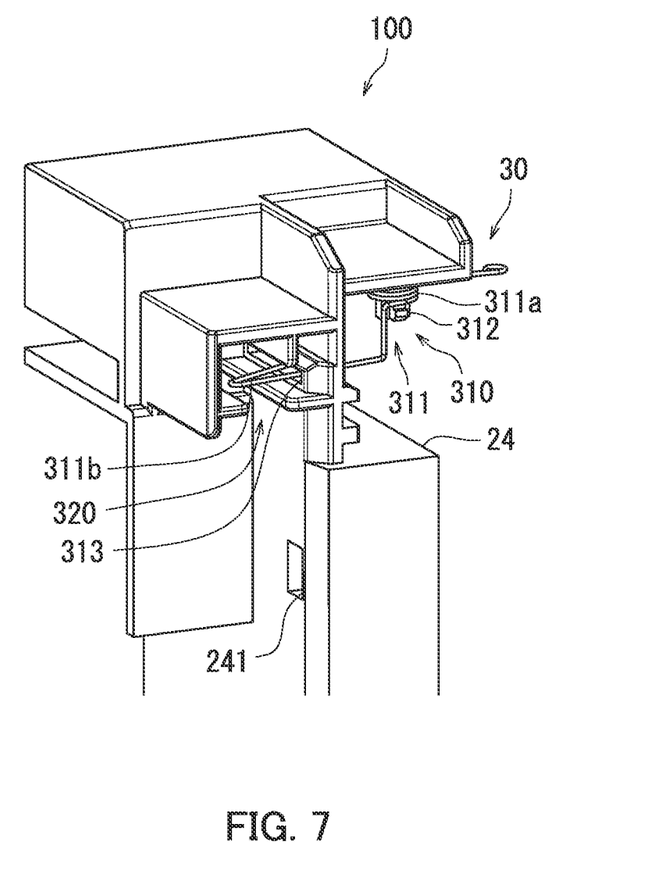
FIG. 7 is a diagram illustrating an urging section.
Figure 8A:
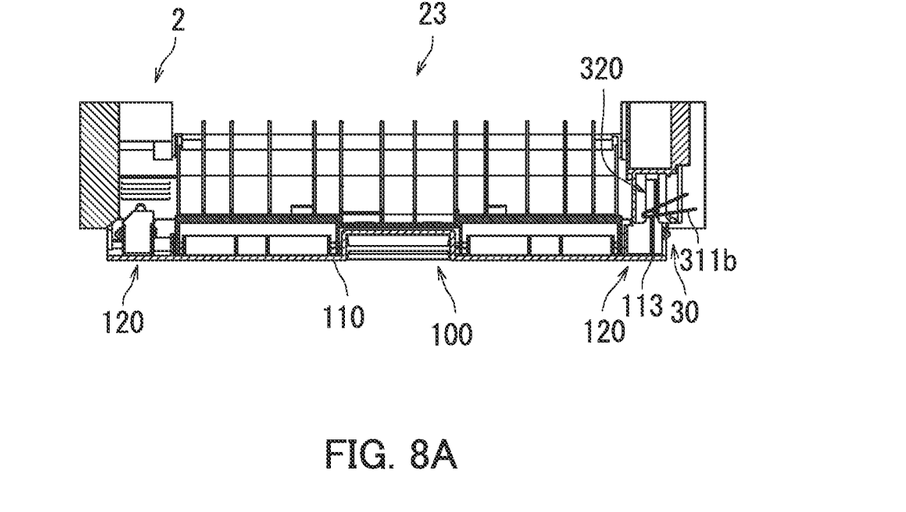
FIG. 8A is a diagram illustrating the cover section before closing the opening.
Figure 8B:
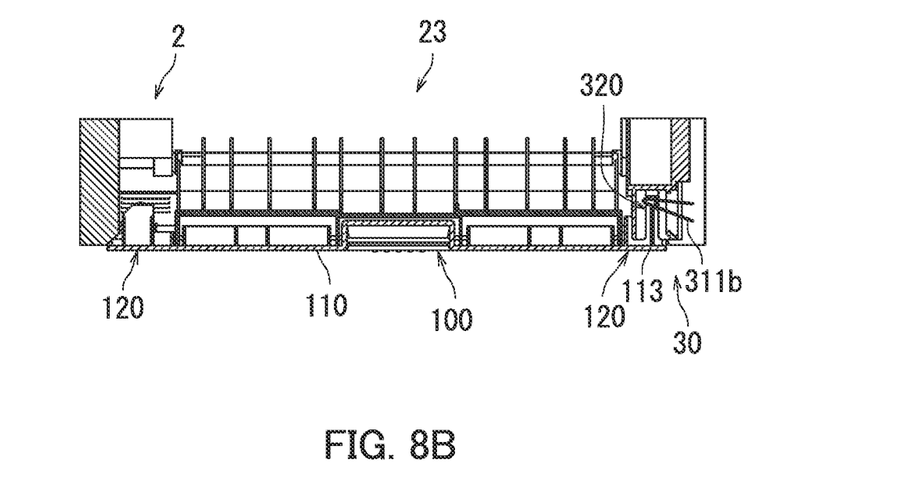
FIG. 8B is a diagram illustrating the cover section closing the opening.

Next, an urging section 30 is described with reference to FIGS. 7, 8A, and 8B. FIG. 7 illustrates the urging section 30. FIG. 8A illustrates a state where the cover section 110 is not closing the opening 23. FIG. 8B illustrates the cover section 110 closing the opening 23. The cover opening and closing device 100 further includes the urging section 30. The urging section 30 urges the cover section 110 in the direction toward the second position. The urging section 30 is provided on one of the side surfaces 24. The urging section 30 is positioned above of the locking hole 241. The urging section 30 includes a spring holding section 310 and a projection holding section 320.

The spring holding section 310 holds a spring. The spring holding section 310 includes a torsion spring 311, a top wall, a bottom wall, and a side wall. The top wall includes a fixing section 312. The side wall has a long hole 313.

The torsion spring 311 urges the cover section 110 in the direction toward the second position. The torsion spring 311 includes a coil section 311a and an arm section 311b. The coil section 311a is attached to the fixing section 312. The arm section 311b makes contact with the cover section 110. The arm section 311b protrudes from the long hole 313. The arm section 311b moves in a front-back direction of the main body section 2.

The fixing section 312 fixes the coil section 311a. The fixing section 312 protrudes from the top wall toward the bottom wall. The fixing section 312 is positioned inside the coil section 311a. The fixing section 312 fixes the coil section 311a such that the arm section 311b makes contact with the cover section 110 at a prescribed position.

The long hole 313 communicates the projection holding section 320 with the spring holding section 310. The long hole 313 opens in the front-back direction of the main body section 2. The arm section 311b is inserted into the long hole 313.

The projection holding section 320 includes a side wall, a bottom wall, and a top wall. The long hole 313 is positioned in the side wall. The bottom wall has a slit. The arm section 311b is positioned in an upper portion of the slit.

As illustrated in FIGS. 8A and 8B, the cover section 110 further includes a projection 113. The projection 113 makes contact with the arm section 311b. The projection 113 is positioned in the slit of the projection holding section 320. The slit guides the projection 113 such that the projection 113 makes contact with the arm section 311b. Accordingly, the torsion spring 311 can easily press against the projection 113 in a front direction of the main body section 2. As illustrated in FIG. 8A for example, in a case in which the cover section 110 is not locked to the main body section 2 by the two locking sections 120, the arm section 311b presses against the projection 113 frontward of the main body section 2. The cover section 110 pivots in the direction toward the second position through the arm section 311b pressing against the projection 113 frontward. Furthermore, as illustrated in FIG. 8B, in a case in which the cover section 110 is locked to the main body section 2 by the two locking sections 120, the projection 113 presses against the arm section 311b backward of the main body section 2.

Since the projection 113 of the cover section 110 is pressed frontward by the urging section 30 even when the cover section 110 is in partial closure, the cover section 110 pivots in the direction toward the second position. As a result, even when the cover section 110 is in partial closure, partial closure can be resolved. Furthermore, since the cover section 110 pivots in the direction toward the second position to open the opening 23, the user can easily know that the cover section 110 is not closed correctly.

Second Embodiment

Figure 9A:
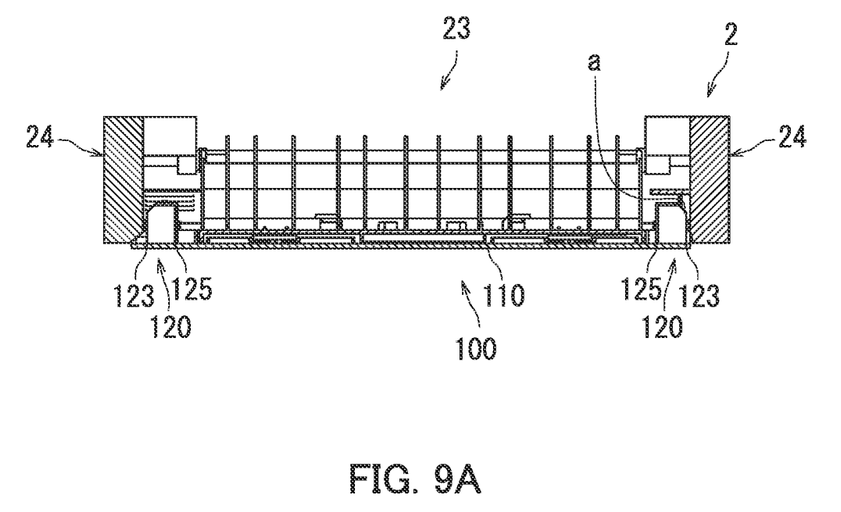
FIG. 9A illustrates a state where the cover section is locked to a main body section according to a second embodiment of the present invention.
Figure 9B:
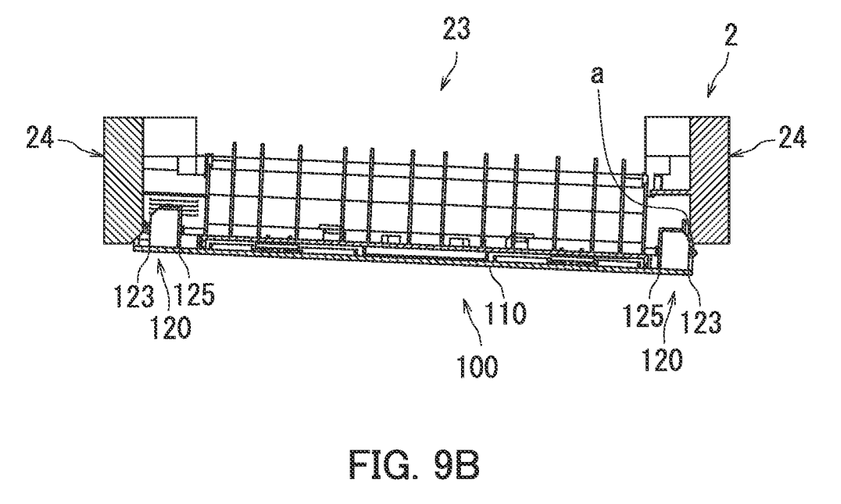
FIG. 9B illustrates a state where the cover section is not locked to the main body section according to the second embodiment.

The following describes the cover opening and closing device 100 according to a second embodiment with reference to FIGS. 9A and 9B. FIG. 9 is a diagram illustrating the locking sections 120 according to the second embodiment. FIG. 9A illustrates a state where the cover section 110 is locked to the main body section 2. FIG. 9B illustrates a state where the cover section 110 is not locked to the main body section 2. The cover opening and closing device 100 according to the second embodiment has the same configuration as the cover opening and closing device 100 according to the first embodiment aside from the edge a of the first wall section 123 of each locking section 120 being notched, and description of shared elements is therefore omitted.

As illustrated in FIG. 9, the edge a of the first wall section 123 of each locking section 120 is notched. The first wall section 123 with the notched edge a is shorter than the second wall section 125. The notched portion of the first wall section 123 is a portion which makes contact with a corresponding one of the side surfaces 24 upon occurrence of partial closure of the cover section 110. As such, the edge a of the notched first wall section 123 does not make contact with the side surface 24 even when the cover section 110 is in partial closure. As a result, partial closure of the cover section 110 can be prevented. Furthermore, since the cover section 110 pivots in the direction toward the second position to open the opening 23, the user can easily know that the cover section 110 is not closed correctly.

Third Embodiment

Figure 10:
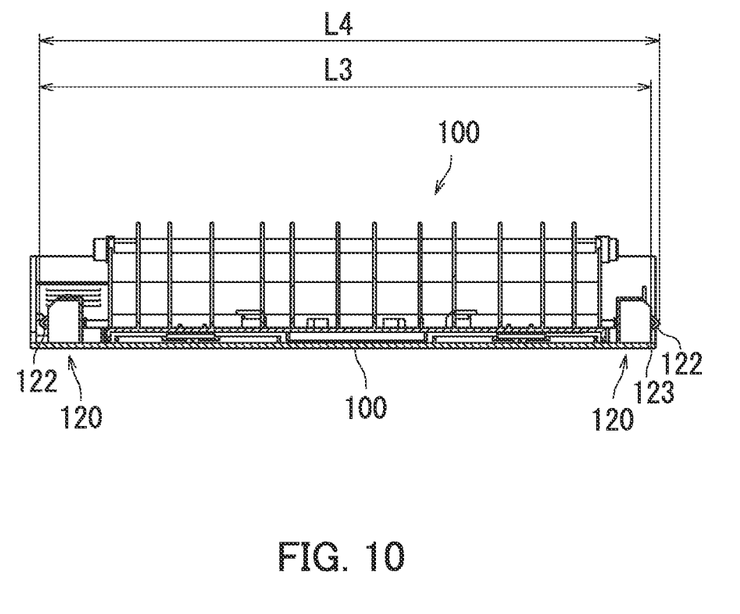
FIG. 10 is a diagram illustrating the cover section according to a third embodiment of the present invention.

The following describes the cover opening and closing device 100 according to a third embodiment with reference to FIGS. 6 and 10. FIG. 10 is a diagram illustrating the cover section 110 according to the third embodiment. The cover section 110 according to the third embodiment has the same configuration as the cover opening and closing device 100 according to the first embodiment aside from the length from the tip of the protrusion body 122 of one locking section 120 to the first wall section 123 of the other locking section 120 being a length L3 and the length from the tip of the protrusion body 122 of the one locking section 120 to the tip of the protrusion body 122 of the other locking section 120 being a length L4, and description of shared elements is therefore omitted.

The locking sections 120 illustrated in FIG. 10 are provided in a pair on the cover section 110. The length L3 illustrated in FIG. 10 is shorter than the length L1 illustrated in FIG. 6. That is, the length L3 is shorter than the horizontal length of the opening 23. Since the length from the tip of the protrusion body 122 of the one locking section 120 to the first wall section 123 of the other locking section 120 is the length L3, neither the protrusion body 122 nor the first wall section 123 makes contact with the side surfaces 24 of the main body section 2. The length LA illustrated in FIG. 10 is longer than the length L1 illustrated in FIG. 6. That is, the length L4 is longer than the horizontal length of the opening 23. Accordingly, the cover section 110 is locked to the main body section 2 only when the cover section 110 is locked to the main body section 2 by the one protrusion body 122 and the other protrusion body 122. As a result, since the cover section 110 pivots in the direction toward the second position to open the opening 23, the user can easily know that the cover section 110 is not closed correctly.

The cover opening and closing device 100 may also be applied to an apparatus that includes a mechanism for opening and closing the cover section 110 other than the image forming apparatus 1.

The embodiments of the present invention are described above with reference to the accompanying drawings (FIGS. 1 to 10). However, the present invention is not limited to the above embodiments and may be implemented in various manners within a scope not departing from the gist thereof. Furthermore, various inventions may be created by appropriately combining elements of configuration disclosed in the above embodiments. For example, some elements of configuration may be removed out of all of the elements of configuration described in the embodiments. In addition, elements of configuration may be appropriately combined across different embodiments. The drawings illustrate main elements of configuration schematically to facilitate understanding, and aspects of the elements of configuration such as thickness, length, number, and interval illustrated in the drawings may differ in practice for the sake of convenience fir drawing preparation. Furthermore, aspects of the elements of configuration such as speed, material, shape, and dimension illustrated in the above embodiments are merely examples, not particular limitations, and may be variously altered within a scope not substantially departing from the configuration of the present invention.

INDUSTRIAL APPLICABILITY

The present invention may be used in the fields of cover opening and closing devices and image forming apparatuses.

The invention claimed is:
1. A cover opening and closing device comprising:
a cover section configured to cover an opening of a main body section;
a rotary shaft which connects the cover section to the main body section in a manner that the cover section is pivotal between a first position and a second position;
a plurality of locking sections configured to lock the cover section in the first position; and
an urging section configured to urge the cover section in a direction toward the second position, wherein
a center of gravity of the cover section is positioned farther outside the main body section than the rotary shaft,
the first position is a position in which the cover section covers the opening,
the second position is a position in which the cover section does not cover the opening,
each of the locking sections includes a protrusion body which protrudes toward the main body section and a holding section which holds the protrusion body,
the holding section includes a side opposite to the main body section,
an edge of the side is notched,
the locking sections are provided in a pair on the cover section,
a length from the protrusion body of one of the locking sections to the side of another of the locking sections is shorter than a horizontal length of the opening, and
when at least one of the locking sections is not locking the cover section, the cover section pivots from the first position to the second position by weight of the cover section and urging by the urging section.
2. The cover opening and closing device according to claim 1, wherein
a pivoting force of the cover section in a direction toward the second position is greater than a locking force of each of the locking sections that locks the cover section to the main body section.
3. The cover opening and closing device according to claim 1, wherein
the cover section includes a projection, and
the urging section includes a spring which urges the projection in the direction toward the second position and a slit which guides the projection such that the projection makes contact with the spring.
4. The cover opening and closing device according to claim 1, wherein
the cover section includes a first cover surface and a second cover surface,
the first cover surface is positioned farther outside of the main body section than the rotary shaft, and
the second cover surface extends from the first cover surface to the rotary shaft.
5. An image forming apparatus comprising:
the cover opening and closing device according to claim 1; and
a main body section having an opening.

6. A cover opening and closing device comprising:
a cover section configured to cover an opening of a main body section;
a rotary shaft which connects the cover section to the main body section in a manner that the cover section is pivotal between a first position and a second position;
a plurality of locking sections configured to lock the cover section in the first position; and
an urging section configured to urge the cover section in a direction toward the second position, wherein
a center of gravity of the cover section is positioned farther outside the main body section than the rotary shaft,
the first position is a position in which the cover section covers the opening,
the second position is a position in which the cover section does not cover the opening,
the cover section includes a projection,
the urging section includes a spring which urges the projection in the direction toward the second position and a slit which guides the projection such that the projection makes contact with the spring, and
when at least one of the locking sections is not locking the cover section, the cover section pivots from the first position to the second position by weight of the cover section and urging by the urging section.

7. The cover opening and closing device according to claim 6, wherein
the cover section includes a first cover surface and a second cover surface,
the first cover surface is positioned farther outside of the main body section than the rotary shaft, and
the second cover surface extends from the first cover surface to the rotary shaft.

8. An image forming apparatus comprising:
the cover opening and closing device according to claim 6; and
a main body section having an opening.

9. A cover opening and closing device comprising:
a cover section configured to cover an opening of a main body section;
a rotary shaft which connects the cover section to the main body section in a manner that the cover section is pivotal between a first position and a second position;
a plurality of locking sections configured to lock the cover section in the first position; and
an urging section configured to urge the cover section in a direction toward the second position, wherein
a center of gravity of the cover section is positioned farther outside the main body section than the rotary shaft,
the first position is a position in which the cover section covers the opening,
the second position is a position in which the cover section does not cover the opening,
the cover section includes a first cover surface and a second cover surface,
the first cover surface is positioned farther outside of the main body section than the rotary shaft,
the second cover surface extends from the first cover surface to the rotary shaft, and
when at least one of the locking sections is not locking the cover section, the cover section pivots from the first position to the second position by weight of the cover section and urging by the urging section.

10. An image forming apparatus comprising:
the cover opening and closing device according to claim 9; and
a main body section having an opening.

* * * * *